United States Patent
Nagayama et al.

(10) Patent No.: US 12,125,928 B2
(45) Date of Patent: Oct. 22, 2024

(54) RESIN COMPOSITION FOR SOLAR CELL ENCAPSULANT, SOLAR CELL ENCAPSULANT, MANUFACTURING METHOD OF SOLAR CELL ENCAPSULANT, AND SOLAR CELL MODULE

(71) Applicant: DOW-MITSUI POLYCHEMICALS CO., LTD., Tokyo (JP)

(72) Inventors: Kei Nagayama, Chiba (JP); Kana Kukita, Chiba (JP); Motoaki Isokawa, Chiba (JP)

(73) Assignee: DOW-MITSUI POLYCHEMICALS CO., LTD., Tokyo (JP)

(*) Notice: Subject to any disclaimer, the term of this patent is extended or adjusted under 35 U.S.C. 154(b) by 21 days.

(21) Appl. No.: 17/783,820

(22) PCT Filed: Dec. 9, 2020

(86) PCT No.: PCT/JP2020/045805
§ 371 (c)(1),
(2) Date: Jun. 9, 2022

(87) PCT Pub. No.: WO2021/125004
PCT Pub. Date: Jun. 24, 2021

(65) Prior Publication Data
US 2023/0006081 A1    Jan. 5, 2023

(30) Foreign Application Priority Data
Dec. 16, 2019 (JP) ................. 2019-226268

(51) Int. Cl.
*H01L 31/048* (2014.01)
*B32B 27/08* (2006.01)
(Continued)

(52) U.S. Cl.
CPC .......... *H01L 31/0481* (2013.01); *B32B 27/08* (2013.01); *C08F 210/02* (2013.01);
(Continued)

(58) Field of Classification Search
None
See application file for complete search history.

(56) References Cited

U.S. PATENT DOCUMENTS

2011/0023943 A1    2/2011  Prejean
2012/0199193 A1*   8/2012  Nishijima ............ C09J 151/06
                                                         136/258
2012/0255610 A1   10/2012  Bokrea et al.

FOREIGN PATENT DOCUMENTS

EP    3 358 629          8/2018
EP    3357987 A1 *       8/2018 ............. B29C 48/15
(Continued)

OTHER PUBLICATIONS

International Search Report, Date of mailing: Feb. 22, 2021, 2 pages.
(Continued)

*Primary Examiner* — Ryan S Cannon
(74) *Attorney, Agent, or Firm* — RANKIN, HILL & CLARK LLP

(57) ABSTRACT

A resin composition for a solar cell encapsulant that is used for forming a solar cell encapsulant, the resin composition including at least one kind of ethylene-polar monomer copolymer (A1) selected from an ethylene-vinyl ester copolymer and an ethylene-unsaturated carboxylic acid ester copolymer, an epoxy group-containing ethylene-based copolymer (A2) (excluding the ethylene-polar monomer copolymer (A1)), an ethylene-α-olefin copolymer (B), and a metal inactivating agent (C).

14 Claims, 1 Drawing Sheet

(51) Int. Cl.
  *C08F 210/02* (2006.01)
  *C08F 210/16* (2006.01)
  *C08F 218/08* (2006.01)
  *C08F 220/32* (2006.01)
  *C08F 230/08* (2006.01)
  *C08J 5/18* (2006.01)
  *C08K 5/24* (2006.01)
  *C08K 5/3472* (2006.01)

(52) U.S. Cl.
  CPC .......... *C08F 210/16* (2013.01); *C08F 218/08* (2013.01); *C08F 220/325* (2020.02); *C08F 230/085* (2020.02); *C08J 5/18* (2013.01); *C08K 5/24* (2013.01); *C08K 5/3472* (2013.01); *B32B 2250/02* (2013.01); *B32B 2311/12* (2013.01); *B32B 2323/04* (2013.01); *B32B 2333/00* (2013.01)

(56) References Cited

FOREIGN PATENT DOCUMENTS

| | | |
|---|---|---|
| JP | 2014-107323 | 6/2014 |
| JP | 2018-174202 | 11/2018 |
| KR | 20180063121 A | 6/2018 |
| WO | 2011014777 A1 | 2/2011 |
| WO | 2011/059009 | 5/2011 |
| WO | 2012/138986 | 10/2012 |
| WO | 2017/057217 | 4/2017 |

OTHER PUBLICATIONS

Extended European Search Report (EESR) dated Dec. 6, 2023 for European Patent Application No. 20900900.0.
Korean Office Action (KROA) dated Apr. 23, 2024 and issued for Korean patent application No. 10-2022-7023842 and its English machine translation.

\* cited by examiner

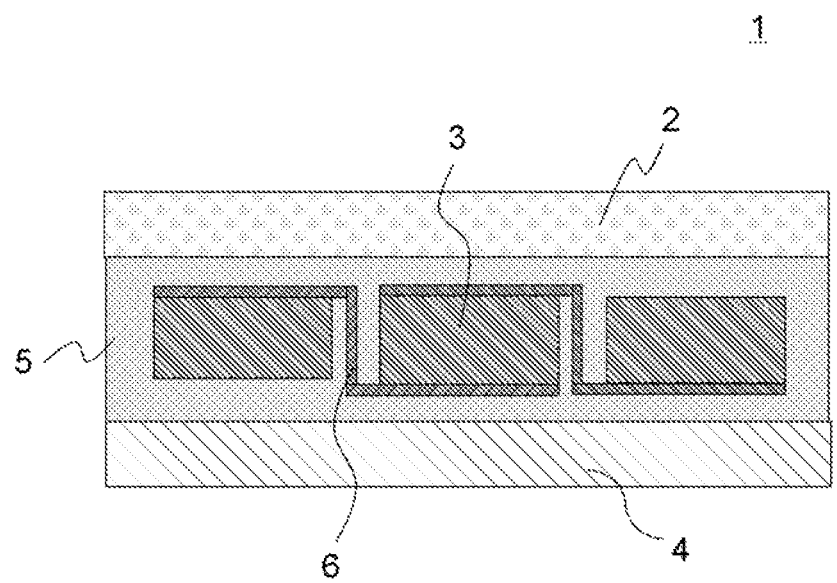

RESIN COMPOSITION FOR SOLAR CELL ENCAPSULANT, SOLAR CELL ENCAPSULANT, MANUFACTURING METHOD OF SOLAR CELL ENCAPSULANT, AND SOLAR CELL MODULE

TECHNICAL FIELD

The present invention relates to a resin composition for a solar cell encapsulant, a solar cell encapsulant, a manufacturing method of a solar cell encapsulant, and a solar cell module.

BACKGROUND ART

In recent years, the distribution of photovoltaic power generation as clean energy has been in progress. Photovoltaic power generation directly converts solar energy into electrical energy using a semiconductor (solar cell element) such as a silicon cell. In order to ensure the long-term reliability of the solar cell element, the solar cell element is sandwiched between encapsulants to protect the solar cell element and to prevent the incorporation of a foreign matter or the intrusion of moisture or the like into the solar cell element.

The solar cell element usually has a metal electrode for collecting electric charges that are obtained by photovoltaic power and is usually configured by connecting a plurality of cells for a solar cell with metal wiring in order to obtain a high electric output. In addition, it is known that there are cases where yellowing occurs in the solar cell encapsulants in the vicinity of the metal electrode or the metal wiring due to deterioration over time.

The yellowing of these solar cell encapsulants reduces the amount of light received by the solar cell element. Therefore, the yellowing of the solar cell encapsulants causes a decrease in the power generation efficiency of solar cell modules, and a solar cell encapsulant capable of effectively preventing yellowing is desired.

Examples of techniques for suppressing such yellowing of solar cell encapsulants include techniques described in Patent Document 1 (Japanese Unexamined Patent Publication No. 2014-107323) and Patent Document 2 (Japanese Unexamined Patent Publication No. 2018-174202).

Patent Document 1 discloses an encapsulating film for a solar cell containing an ethylene-based copolymer, a pigment, and a metal inactivating agent, in which the metal inactivating agent contains at least one kind of compound selected from the group consisting of a triazole-based compound, a benzotriazole-based compound, and a hydrazine compound. Patent Document 1 describes that such an encapsulating film for a solar cell is capable of suppressing the occurrence of yellowing.

Patent Document 2 discloses an encapsulant for a solar cell containing an ethylene-polar monomer copolymer, a cross-linking agent, an ultraviolet absorber, and a carbodiimide compound, in which the cross-linking agent has a specific structure, the ultraviolet absorber is a benzotriazole-based ultraviolet absorber, and the carbodiimide compound is a cyclic carbodiimide compound having a specific structure. Patent Document 2 describes that such an encapsulant for a solar cell is capable of maintaining an acid trapping function for a long period of time even in a high temperature and high humidity environment and in an environment exposed to ultraviolet rays for a long period of time, suppresses yellowing, and is highly transparent and excellent in terms of the cross-linking efficiency.

RELATED DOCUMENT

Patent Document

[Patent Document 1] Japanese Unexamined Patent Publication No. 2014-107323
[Patent Document 2] Japanese Unexamined Patent Publication No. 2018-174202

SUMMARY OF THE INVENTION

Technical Problem

A demand for suppressing the yellowing of solar cell encapsulants is growing more intense.

The present invention has been made in view of the above-described circumstances and provides a solar cell encapsulant having improved yellowing resistance.

Solution to Problem

The present inventors repeated intensive studies to solve the above-described problems. As a result, the present inventors found that it is possible to improve the yellowing resistance of a solar cell encapsulant that is obtained, by combining at least one kind of ethylene-polar monomer copolymer selected from an ethylene-vinyl ester copolymer and an ethylene-unsaturated carboxylic acid ester copolymer, an epoxy group-containing ethylene-based copolymer, an ethylene-α-olefin copolymer, and a metal inactivating agent and reached the present invention.

That is, according to the present invention, a resin composition for a solar cell encapsulant, a solar cell encapsulant, a manufacturing method of a solar cell encapsulant, and a solar cell module, which will be described below, are provided.

[1]
A resin composition for a solar cell encapsulant that is a resin composition which is used for forming a solar cell encapsulant, the resin composition including:
  at least one kind of ethylene-polar monomer copolymer (A1) selected from an ethylene-vinyl ester copolymer and an ethylene-unsaturated carboxylic acid ester copolymer,
  an epoxy group-containing ethylene-based copolymer (A2) (excluding the ethylene-polar monomer copolymer (A1)),
  an ethylene-α-olefin copolymer (B), and
  a metal inactivating agent (C).

[2]
The resin composition for a solar cell encapsulant according to [1],
  in which at least a part of the ethylene-polar monomer copolymer (A1) and the epoxy group-containing ethylene-based copolymer (A2) is modified with a silane coupling agent.

[3]
The resin composition for a solar cell encapsulant according to [1] or [2],
  in which a density of the ethylene-α-olefin copolymer (B) is 910 kg/m$^3$ or less.

[4]
The resin composition for a solar cell encapsulant according to any one of [1] to [3],

[5]
The resin composition for a solar cell encapsulant according to any one of [1] to [4],
in which the metal inactivating agent (C) contains at least one kind selected from a compound having a hydrazine skeleton and a compound having a triazole skeleton.

[6]
The resin composition for a solar cell encapsulant according to any one of [1] to [5],
in which, when a total amount of resin components that are contained in the resin composition for a solar cell encapsulant is defined as 100 parts by mass, a content of the metal inactivating agent (C) is 0.05 parts by mass or more.

[7]
The resin composition for a solar cell encapsulant according to any one of [1] to [6],
in which the epoxy group-containing ethylene-based copolymer (A2) contains at least one kind selected from an ethylene-glycidyl (meth)acrylate copolymer, an ethylene-glycidyl (meth)acrylate-vinyl acetate copolymer, and an ethylene-glycidyl (meth)acrylate-(meth)acrylate ester copolymer.

[8]
The resin composition for a solar cell encapsulant according to any one of [1] to [7],
in which, in the epoxy group-containing ethylene-based copolymer (A2), when a total of constituent units that constitute the epoxy group-containing ethylene-based copolymer (A2) is defined as 100% by mass, an ethylene-derived constituent unit is 70% by mass or more and 95% by mass or less.

[9]
A solar cell encapsulant including a layer formed of the resin composition for a solar cell encapsulant according to any one of [1] to [8].

[10]
A solar cell encapsulant,
in which a layer formed of the resin composition for a solar cell encapsulant according to any one of [1] to [8] and
a layer formed of a resin composition containing at least one kind of ethylene-based copolymer selected from an ethylene-vinyl ester copolymer, an ethylene-α-olefin copolymer, and an ionomer of an ethylene-unsaturated carboxylic acid-based copolymer are laminated.

[11]
A manufacturing method of a solar cell encapsulant, the method including a step of extruding the resin composition for a solar cell encapsulant according to any one of [1] to [8] into a sheet shape.

[12]
A solar cell module including:
a solar cell element, and
an encapsulated resin layer formed of the solar cell encapsulant according to [9] or [10] that encapsulates the solar cell element.

[13]
The solar cell module according to [12], further including a metal material provided adjacent to the encapsulated resin layer,
in which a layer formed of the resin composition for a solar cell encapsulant according to any one of the [1] to [8] that constitutes the encapsulated resin layer and at least a part of the metal material are in contact with each other.

[14]
The solar cell module according to [13],
in which the metal material contains at least one kind of metal selected from copper, tin, lead, iron, bismuth, aluminum, and silver.

[15]
The solar cell module according to [13] or [14],
in which the metal material contains copper.

Advantageous Effects of Invention

According to the present invention, it is possible to provide a solar cell encapsulant having improved yellowing resistance.

BRIEF DESCRIPTION OF THE DRAWINGS

FIG. 1 is a cross-sectional view schematically illustrating an example of the structure of a solar cell module of an embodiment according to the present invention.

DESCRIPTION OF EMBODIMENTS

Hereinafter, an embodiment of the present invention will be described using a drawing. The drawing is a schematic view and does not match actual dimensional ratios. Unless particularly otherwise described, the expression "X to Y" for numerical value ranges represents equal to or more than X and equal to or less than Y. In addition, (meth)acryl means acryl or methacryl.

1. Resin Composition for Solar Cell Encapsulant

A resin composition for a solar cell encapsulant according to the present embodiment (hereinafter, also referred to as the resin composition (P)) is a resin composition which is used for forming a solar cell encapsulant, the resin composition containing at least one kind of ethylene-polar monomer copolymer (A1) selected from an ethylene-vinyl ester copolymer and an ethylene-unsaturated carboxylic acid ester copolymer, an epoxy group-containing ethylene-based copolymer (A2) (excluding the ethylene-polar monomer copolymer (A1)), an ethylene-α-olefin copolymer (B), and a metal inactivating agent (C).

The resin composition (P) according to the present embodiment contains the ethylene-polar monomer copolymer (A1), the epoxy group-containing ethylene-based copolymer (A2), the ethylene-α-olefin copolymer (B), and the metal inactivating agent (C) and is thus capable of improving the yellowing resistance of a solar cell encapsulant to be obtained.

The reason for this is not clear, but is assumed that the epoxy group-containing ethylene-based copolymer (A2) and a functional group of the metal inactivating agent (C) (for example, a hydroxy group of a phenyl group) interact or react with each other, which makes it easier for a metal ion to be coordinated to the metal inactivating agent (C) and thus suppresses the promotion of deterioration of a resin due to the metal ion.

For the above-described reason, it is considered that the use of the resin composition for a solar cell encapsulant according to the present embodiment enables the obtainment of a solar cell encapsulant having improved yellowing resistance.

In the resin composition (P) according to the present embodiment, when the total of the resin composition (P) is defined as 100% by mass, the total content of the ethylene-polar monomer copolymer (A1), the epoxy group-containing ethylene-based copolymer (A2), and the ethylene-α-olefin copolymer (B) is preferably equal to or more than 60% by mass, more preferably equal to or more than 70% by mass, even more preferably equal to or more than 80% by mass, far even more preferably equal to or more than 90% by mass, and particularly preferably equal to or more than 95% by mass. When the total content of the ethylene-polar monomer copolymer (A1), the epoxy group-containing ethylene-based copolymer (A2), and the ethylene-α-olefin copolymer (B) is within the above-described range, it is possible to further improve the balance of the transparency, interlayer adhesiveness, insulating properties, rigidity, water resistance, flexibility, mechanical properties, heat resistance, handleability, and processability of solar cell encapsulants to be obtained and the PID resistance and the like of solar cell modules to be obtained.

Hereinafter, each component that constitutes the resin composition (P) according to the present embodiment will be described.

<Ethylene-Polar Monomer Copolymer (A1)>

The ethylene-polar monomer copolymer (A1) according to the present embodiment contains one or more kinds selected from an ethylene-vinyl ester copolymer and an ethylene-unsaturated carboxylic acid ester copolymer.

As the ethylene-vinyl ester copolymer, it is possible to use one or more kinds selected from an ethylene-vinyl acetate copolymer, an ethylene-vinyl propionate copolymer, an ethylene-vinyl butyrate copolymer, an ethylene-vinyl stearate copolymer and the like.

The ethylene-unsaturated carboxylic acid ester copolymer according to the present embodiment is a polymer obtained by copolymerizing ethylene and at least one kind of unsaturated carboxylic acid ester.

Specifically, a copolymer made up of ethylene and an alkyl ester of an unsaturated carboxylic acid can be exemplified.

Examples of an unsaturated carboxylic acid in the unsaturated carboxylic acid ester include acrylic acid, methacrylic acid, ethacrylic acid, crotonic acid, fumaric acid, maleic acid, maleic anhydride, itaconic acid, itaconic anhydride, and the like.

Examples of an alkyl moiety in the alkyl ester of the unsaturated carboxylic acid include alkyl groups having 1 to 12 carbon atoms, and more specifically, alkyl groups such as methyl, ethyl, n-propyl, isopropyl, n-butyl, isobutyl, secondary butyl, 2-ethylhexyl, and isooctyl can be exemplified. In the present embodiment, the number of carbon atoms in the alkyl moiety of the alkyl ester is preferably 1 to 8.

As the unsaturated carboxylic acid ester, one or more kinds selected from (meth)acrylic acid esters such as methyl (meth)acrylate, ethyl (meth)acrylate, isopropyl (meth)acrylate, n-propyl (meth)acrylate, isobutyl (meth)acrylate, n-butyl (meth)acrylate, isooctyl (meth)acrylate, and 2-ethylhexyl (meth)acrylate are preferably contained. These unsaturated carboxylic acid esters may be used singly or two or more kinds thereof may be used in combination. Among these, one or more kinds selected from methyl (meth)acrylate, ethyl (meth)acrylate, isopropyl (meth)acrylate, n-propyl (meth)acrylate, isobutyl (meth)acrylate, and n-butyl (meth)acrylate are more preferably contained.

In the present embodiment, the ethylene-unsaturated carboxylic acid ester copolymer is preferably an ethylene-(meth)acrylic acid ester copolymer. Particularly, a copolymer containing one kind of compound as the (meth)acrylic acid ester is preferable. Examples of such a copolymer include an ethylene-methyl (meth)acrylate copolymer, an ethylene-ethyl (meth)acrylate copolymer, an ethylene-isopropyl (meth)acrylate copolymer, an ethylene-n-propyl (meth)acrylate copolymer, an ethylene-isobutyl (meth)acrylate copolymer, an ethylene-n-butyl (meth)acrylate copolymer, an ethylene-isooctyl (meth)acrylate copolymer, an ethylene-2-ethylhexyl (meth)acrylate copolymer, and the like.

The ethylene-polar monomer copolymer (A1) preferably contains one or more kinds selected from an ethylene-vinyl acetate copolymer, an ethylene-methyl (meth)acrylate copolymer, an ethylene-ethyl (meth)acrylate copolymer, an ethylene-isopropyl (meth)acrylate copolymer, an ethylene-n-propyl (meth)acrylate copolymer, an ethylene-isobutyl (meth)acrylate copolymer, and an ethylene-n-butyl (meth)acrylate copolymer and more preferably contains an ethylene-vinyl acetate copolymer.

In the present embodiment, the ethylene-polar monomer copolymer (A1) may be used singly or two or more kinds may be used in combination.

The content of a polar monomer in the ethylene-polar monomer copolymer (A1) is preferably equal to or more than 5% by mass and equal to or less than 50% by mass, more preferably equal to or more than 8% by mass and equal to or less than 45% by mass, and particularly preferably equal to or more than 8% by mass and equal to or less than 30% by mass.

In a case where the polar monomer is vinyl acetate, the content of the polar monomer can be measured according to, for example, JIS K7192: 1999. In addition, in a case where the polar monomer is an unsaturated carboxylic acid ester, the content of the polar monomer is measured from, for example, the infrared absorption spectrum (IR) attributable to the unsaturated carboxylic acid ester. For example, in a case where the unsaturated carboxylic acid ester is ethyl acrylate (EA), the content of the polar monomer is obtained from the absorbance at 860 cm$^{-1}$ attributable to EA. Here, the calibration curve is obtained from the correlation between the EA concentration obtained from the nuclear magnetic resonance spectrum (NMR) and the absorbance at 860 cm$^{-1}$ of IR.

In the present embodiment, from the viewpoint of further improving process stability, the melt mass flow rate (MFR) of the ethylene-polar monomer copolymer (A1) as measured according to JIS K 7210: 1999 under conditions of 190° C. and a load of 2160 g is preferably equal to or more than 0.1 g/10 minutes and equal to or less than 300 g/10 minutes, more preferably equal to or more than 0.2 g/10 minutes and equal to or less than 200 g/10 minutes, even more preferably equal to or more than 0.5 g/10 minutes and equal to or less than 180 g/10 minutes, and particularly preferably equal to or more than 1.0 g/10 minutes and equal to or less than 30 g/10 minutes.

The MFR of the ethylene-polar monomer copolymer (A1) may be adjusted by blending a plurality of ethylene-polar monomer copolymers (A1) having different MFRs.

A manufacturing method of the ethylene-polar monomer copolymer in the ethylene-polar monomer copolymer (A1) according to the present embodiment is not particularly limited, and the ethylene-polar monomer copolymer can be produced by a known method. For example, the ethylene-polar monomer copolymer can be obtained by the radical copolymerization of the individual polymerization components at a high temperature and a high pressure. In addition, as the ethylene-polar monomer copolymer in the ethylene-polar monomer copolymer (A1), a commercially available product may be used.

At least a part of the ethylene-polar monomer copolymer (A1) is preferably modified with a silane coupling agent. In such a case, the adhesiveness of solar cell encapsulants to be obtained can be further improved.

Here, the silane coupling agent in the ethylene-polar monomer copolymer (A1) according to the present embodiment preferably contains one or more kinds selected from a silane coupling agent having a polymerizable group, a silane coupling agent having an amino group, and a silane coupling agent having an epoxy group.

The amount of the silane coupling agent that can be contained is usually equal to or less than 5 parts by mass and preferably 0.02 to 4 parts by mass with respect to 100 parts by mass of the ethylene-polar monomer copolymer (A1). When the silane coupling agent is contained within the above-described range, the adhesiveness of solar cell encapsulants to be obtained can be further improved.

Here, the modification of the silane coupling agent into the ethylene-polar monomer copolymer (A1) can be performed by, for example, the same method as for the modification of the silane coupling agent into the epoxy group-containing ethylene-based copolymer (A2) to be described below.

In addition, the modification of the silane coupling agent into the ethylene-polar monomer copolymer (A1) and the modification of the silane coupling agent into the epoxy group-containing ethylene-based copolymer (A2) may be performed at the same time.

Here, in a case where the modification of the silane coupling agent into the ethylene-polar monomer copolymer (A1) and the modification of the silane coupling agent into the epoxy group-containing ethylene-based copolymer (A2) are performed at the same time, the amount of a polymerization initiator that is used for the modification and can be contained is, for example, 0.1 to 5 parts by mass and preferably 0.2 to 3 parts by mass with respect to a total of 100 parts by mass of the ethylene-polar monomer copolymer (A1) and the epoxy group-containing ethylene-based copolymer (A2).

The amount of the silane coupling agent that can be contained is, for example, equal to or less than 5 parts by mass and preferably 0.02 to 3 parts by mass with respect to a total of 100 parts by mass of the ethylene-polar monomer copolymer (A1) and the epoxy group-containing ethylene-based copolymer (A2). When the silane coupling agent is contained within the above-described range, the adhesiveness of solar cell encapsulants to be obtained can be further improved.

When the total of the resin components in the resin composition (P) is defined as 100% by mass, the content of the silane coupling agent is preferably equal to or more than 0.01% by mass and equal to or less than 2% by mass and more preferably equal to or more than 0.05% by mass and equal to or less than 1.0% by mass. Here, the content of the silane coupling agent also includes the silane coupling agent that has been grafted to the ethylene-polar monomer copolymer (A1) and the epoxy group-containing ethylene-based copolymer (A2).

When the total of the resin composition (P) is defined as 100% by mass, the content of the ethylene-polar monomer copolymer (A1) in the resin composition (P) according to the present embodiment is preferably equal to or more than 1% by mass and equal to or less than 10% by mass, more preferably equal to or more than 2% by mass and equal to or less than 8% by mass, and particularly preferably equal to or more than 3% by mass and equal to or less than 7% by mass. When the content of the ethylene-polar monomer copolymer (A1) is within the above-described range, the performance balance of the transparency, adhesiveness, moisture resistance, insulating properties, flexibility, heat resistance, and processability of solar cell encapsulants to be obtained can be further improved.

<Epoxy Group-Containing Ethylene-Based Copolymer (A2)>

Examples of the epoxy group-containing ethylene-based copolymer (A2) include glycidyl group-containing ethylene-based copolymers.

Examples of the glycidyl group-containing ethylene-based copolymers include at least one kind selected from an ethylene-glycidyl (meth)acrylate copolymer, an ethylene-glycidyl (meth)acrylate-vinyl acetate copolymer, an ethylene-glycidyl (meth)acrylate-(meth)acrylate ester copolymer, and the like.

The epoxy group-containing ethylene-based copolymer (A2) can be obtained by copolymerizing a polymerizable group such as glycidyl (meth)acrylate, glycidyl vinyl ether, 1,2-epoxy-4-vinylcyclohexane, or 3,4-epoxycyclohexylmethyl methacrylate and a monomer having an epoxy group with ethylene. In addition, an epoxy group may be introduced by the graft polymerization of a monomer having an epoxy group into an ethylene-based copolymer.

The content proportion of a constituent unit derived from a monomer containing an epoxy group in the epoxy group-containing ethylene-based copolymer (A2) is preferably equal to or more than 2% by mass and equal to or less than 30% by mass, more preferably equal to or more than 3% by mass and equal to or less than 25% by mass, and even more preferably equal to or more than 3% by mass and equal to or less than 15% by mass.

When the content proportion of the constituent unit derived from the monomer containing an epoxy group is equal to or more than the lower limit value, the interlayer adhesiveness of solar cell encapsulants to be obtained to solar cell modules become more favorable, and the transparency and flexibility of the solar cell encapsulants also become more favorable. In addition, when the content proportion is equal to or less than the upper limit value, the processability of the solar cell encapsulants improves.

"Glycidyl (meth)acrylate" represents one or both of glycidyl methacrylate and glycidyl acrylate.

The "ethylene-based copolymer" in the epoxy group-containing ethylene-based copolymer (A2) means that a constituent unit derived from ethylene is the main component. Furthermore, the "main component" mentioned herein means that the content of the "ethylene-derived constituent unit" is the largest among all of the constituent units. For example, in the case of a copolymer made up of constituent units that are each derived from ethylene, glycidyl (meth) acrylate, and vinyl acetate, the fraction of the constituent unit derived from ethylene is larger than the fraction of a constituent unit derived from glycidyl (meth)acrylate or a constituent unit derived from vinyl acetate.

When the total of the constituent units that constitute the epoxy group-containing ethylene-based copolymer (A2) is defined as 100% by mass, the fraction of the ethylene-derived constituent unit in the epoxy group-containing ethylene-based copolymer (A2) is preferably equal to or more than 50% by mass, more preferably equal to or more than 65% by mass, even more preferably equal to or more than 70% by mass, and particularly preferably equal to or more than 75% by mass and is preferably equal to or less than 95% by mass, more preferably equal to or less than 90% by mass, and even more preferably equal to or less than 85% by mass.

At this time, the epoxy group-containing ethylene-based copolymer may further contain a different monomer unit other than ethylene and the monomers having an epoxy group.

Examples of the different monomer include vinyl esters such as vinyl acetate and vinyl propionate; unsaturated carboxylic acid esters such as acrylic acid ester, methacrylic acid ester, ethacrylic acid ester, crotonic acid ester, fumaric acid ester, maleic acid ester, maleic anhydride ester, itaconic acid ester, and itaconic acid anhydride ester; and the like. Examples of an ester group include alkyl ester groups having 1 to 12 carbon atoms, and more specifically, alkyl ester groups such as methyl ester, ethyl ester, n-propyl ester, isopropyl ester, n-butyl ester, isobutyl ester, secondary butyl ester, 2-ethylhexyl ester, and isooctyl ester can be exemplified.

Among these, at least one kind selected from vinyl acetate and (meth)acrylic acid ester is preferable.

Specifically, in addition to copolymers including the constituent unit derived from ethylene and the constituent unit derived from glycidyl (meth)acrylate, copolymers further containing, in addition to these two constituent units, at least one of a constituent unit derived from vinyl acetate and a constituent unit derived from (meth)acrylic acid ester are exemplified.

The upper limit value of the content proportion of the constituent unit derived from a vinyl ester such as vinyl acetate and the constituent unit derived from an unsaturated carboxylic acid ester such as (meth)acrylic acid ester is preferably equal to or less than 30% by mass and more preferably equal to or less than 20% by mass. In such a case, the moisture permeability of solar cell encapsulants decreases, and the moisture resistance can be further improved.

The lower limit value of the content proportion of the constituent unit derived from the vinyl ester such as vinyl acetate and the constituent unit derived from the unsaturated carboxylic acid ester such as (meth)acrylic acid ester is not particularly limited, but is preferably equal to or more than 0.1% by mass, more preferably equal to or more than 0.5% by mass, and even more preferably equal to or more than 1% by mass. Furthermore, the content proportion of the constituent unit derived from the vinyl ester such as vinyl acetate and the constituent unit derived from the unsaturated carboxylic acid ester such as (meth)acrylic acid ester is preferably within a range of 0.1% to 30% by mass, more preferably within a range of 0.5% to 20% by mass, and particularly preferably within a range of 1% to 20% by mass.

As the epoxy group-containing ethylene-based copolymer (A2), one kind of copolymer can be used singly or two or more kinds of copolymers having different copolymerization rates or the like can be used in combination.

When the total of the resin composition (P) is defined as 100% by mass, the content of the epoxy group-containing ethylene-based copolymer (A2) in the resin composition (P) according to the present embodiment is preferably equal to or more than 1% by mass and equal to or less than 10% by mass, more preferably equal to or more than 2% by mass and equal to or less than 8% by mass, and particularly preferably equal to or more than 3% by mass and equal to or less than 7% by mass. When the content of the epoxy group-containing ethylene-based copolymer (A2) is within the above-described range, the performance balance of the transparency, adhesiveness, moisture resistance, insulating properties, flexibility, heat resistance, and processability of solar cell encapsulants to be obtained can be further improved.

At least a part of the epoxy group-containing ethylene-based copolymer (A2) is preferably modified with a silane coupling agent. In such a case, the adhesiveness of solar cell encapsulants to be obtained can be further improved.

Here, in the resin composition (P) according to the present embodiment, the silane coupling agent in the epoxy group-containing ethylene-based copolymer (A2) preferably contains one or more kinds selected from a silane coupling agent having a polymerizable group, a silane coupling agent having an amino group, and a silane coupling agent having an epoxy group.

Here, the modification of the silane coupling agent into the epoxy group-containing ethylene-based copolymer (A2) is, for example, a method in which the epoxy group-containing ethylene-based copolymer (A2) and a silane coupling agent having an amino group or an epoxy group are reacted with each other under heating (at, for example, 100° C. to 200° C.) (modification method 1), a method in which a silane coupling agent having a polymerizable group is graft-polymerized into the epoxy group-containing ethylene-based copolymer (A2) using a polymerization initiator (modification method 2), or the like.

In the modification method 1, the amino group or the epoxy group in the silane coupling agent and a glycidyl group in the epoxy group-containing ethylene-based copolymer (A2) react with each other, whereby the silane coupling agent is introduced into a side chain of the epoxy group-containing ethylene-based copolymer (A2).

In the modification method 2, the silane coupling agent can be manufactured by, for example, melting and kneading the epoxy group-containing ethylene-based copolymer (A2), the silane coupling agent having a polymerizable group, and a radical polymerization initiator using an extruder, a kneader, a Banbury mixer, or the like at a temperature equal to or higher than the melting point of the epoxy group-containing ethylene-based copolymer (A2) and equal to or higher than the decomposition temperature of the radical polymerization initiator. These reactions can also be performed in solutions.

As the polymerization initiator, a usually-used polymerization initiator can be used, but an organic peroxide is preferable.

As the organic peroxide, a known organic peroxide that can be used as a polymerization initiator can be used, and specific examples thereof include diacyl peroxide compounds, alkyl peroxy ester compounds, peroxydicarbonate compounds, peroxycarbonate compounds, peroxyketal compounds, dialkyl peroxide compounds, hydroperoxide compounds, ketone peroxide compounds, and the like.

Among these, dialkyl peroxide compounds are preferable, and 2,5-dimethyl-2,5-di(t-butylperoxy)hexane, 1,3-di(2-t-butylperoxyisopropyl)benzene, di-t-butyl peroxide, 2,5-dimethyl-2,5-di(t-butylperoxy)hexyne-3 are more preferable.

Examples of the silane coupling agent having a polymerizable group include vinyltrimethoxysilane, vinyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropylmethyldimethoxysilane, 3-acryloxypropyltrimethoxysilane, 3-acryloxypropylmethyldiethoxysilane, 3-acryloxypropyltriethoxysilane, and the like.

Examples of the silane coupling agent having an amino group include hydrochlorides of N-(2-aminoethyl)-3-aminopropyltrimethoxysilane, N-(2-aminoethyl)-3-aminopropylmethyldimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane and the like.

Examples of the silane coupling agent having an epoxy group include 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, and the like.

In the present embodiment, from the viewpoint of further improving process stability, the melt mass flow rate (MFR) of the epoxy group-containing ethylene-based copolymer (A2) as measured according to JIS K 7210:1999 under conditions of 190° C. and a load of 2160 g is preferably equal to or more than 0.1 g/10 minutes and equal to or less than 50 g/10 minutes, more preferably equal to or more than 0.5 g/10 minutes and equal to or less than 30 g/10 minutes, and even more preferably equal to or more than 1 g/10 minutes and equal to or less than 20 g/10 minutes.

The amount of the polymerization initiator that is used for the modification and can be contained is usually 0.1 to 5 parts by mass and preferably 0.5 to 3 parts by mass with respect to 100 parts by mass of the epoxy group-containing ethylene-based copolymer (A2).

The amount of the silane coupling agent that can be contained is usually equal to or less than 5 parts by mass and preferably 0.02 to 4 parts by mass with respect to 100 parts by mass of the epoxy group-containing ethylene-based copolymer (A2). When the silane coupling agent is contained within the above-described range, the adhesiveness of solar cell encapsulants to be obtained can be further improved.

In the resin composition (P) according to the present embodiment, the mass ratio of the content of the ethylene-polar monomer copolymer (A1) to the content of the epoxy group-containing ethylene-based copolymer (A2) in the resin composition (P) is preferably equal to or more than 0.1 and equal to or less than 10 and more preferably equal to or more than 0.5 and equal to or less than 5. In such a case, it is possible to further improve the balance of the adhesiveness, flexibility, mechanical properties, heat resistance, handleability, processability, and the like of solar cell encapsulants to be obtained.

<Ethylene-α-Olefin Copolymer (B)>

Regarding the ethylene-α-olefin copolymer (B), when the content of all constituent units (monomer units) that constitute the copolymer is defined as 100 mol %, the content proportion of a constituent unit derived from an α-olefin is preferably equal to or more than 5 mol %. The content proportion is more preferably equal to or more than 10 mol %. When the content proportion of the constituent unit derived from the α-olefin is within the above-described range, the transparency and bleed resistance of solar cell encapsulants to be obtained become more favorable. The upper limit is less than 50 mol %, preferably equal to or less than 40 mol %, and particularly preferably equal to or less than 30 mol %.

As the α-olefin, an α-olefin having 3 to 20 carbon atoms is preferable. Specific examples of 3 to 20 carbon atoms include linear α-olefins such as propylene, 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nanodecene, and 1-eicosene; branched α-olefins such as 3-methyl-1-butene, 3-methyl-1-pentene, 4-methyl-1-pentene, 2-ethyl-1-hexene, and 2,2,4-trimethyl-1-pentene; and the like, and these α-olefins may be used singly or two or more kinds thereof may be used in combination.

Among these, the number of carbon atoms in the α-olefin is preferably 3 to 10 and more preferably 3 to 8 from the viewpoint of versatility (cost, mass productivity, or easiness in procurement).

The ethylene-α-olefin copolymer is preferably an ethylene-propylene copolymer, an ethylene-1-butene copolymer, an ethylene-4-methyl-1-pentene copolymer, an ethylene-1-hexene copolymer, or an ethylene-1-octene copolymer, and, in all of the ethylene-α-olefin copolymers, the content of an ethylene-derived constituent unit is equal to or more than 50 mol %.

The ethylene-α-olefin copolymers may be used singly or two or more kinds thereof may be used in combination.

The ethylene-α-olefin copolymer can be manufactured by, for example, a slurry polymerization method, a solution polymerization method, a bulk polymerization method, a gas phase polymerization method or the like in which a metallocene-based catalyst is used.

The density of the ethylene-α-olefin copolymer as measured according to JIS K 7112: 1999 is preferably equal to or more than 850 kg/m$^3$, more preferably equal to or more than 860 kg/m$^3$, and particularly preferably equal to or more than 870 kg/m$^3$. When the density of the ethylene-α-olefin copolymer is equal to or more than the above-described lower limit value, the heat resistance becomes more favorable.

The density of the ethylene-α-olefin copolymer as measured according to JIS K 7112: 1999 is preferably equal to or less than 910 kg/m$^3$. When the density of the ethylene-α-olefin copolymer is equal to or less than the above-described upper limit value, the balance of the adhesiveness, flexibility and transparency of solar cell encapsulants becomes more favorable.

When the total of the resin composition (P) is defined as 100% by mass, the content of the ethylene-α-olefin copolymer (B) in the resin composition (P) according to the present embodiment is preferably equal to or more than 80% by mass, more preferably equal to or more than 84% by mass, and even more preferably equal to or more than 86% by mass. The upper limit of the content of the ethylene-α-olefin copolymer (B) is not particularly limited, but is, for example, preferably equal to or less than 98% by mass, more preferably equal to or less than 96% by mass, and even more preferably equal to or less than 94% by mass.

When the content of the ethylene-α-olefin copolymer (B) is within the above-described range, the performance balance of the transparency, adhesiveness, moisture resistance, insulating properties, flexibility, heat resistance, and processability of solar cell encapsulants to be obtained can be further improved.

<Metal Inactivating Agent (C)>

As the metal inactivating agent (C) according to the present embodiment, an agent well known as a compound that suppresses metal damage of thermoplastic resins can be used. Two or more kinds of metal inactivating agents may be jointly used.

Examples of the metal inactivating agent (C) according to the present embodiment include a compound having a hydrazine skeleton, a compound having a triazole skeleton, and the like.

Examples of the compound having a hydrazine skeleton include decamethylene dicarboxyl-disalicyloyl hydrazide, 2',3-bis[3-[3,5-di-tert-butyl-4-hydroxyphenyl] propionyl] propionohydrazide, isophthalic acid bis(2-phenoxypropionylhydrazide).

Examples of the compound having a triazole skeleton include 3-(N-salicyloyl) amino-1,2,4-triazole.

In addition to the compound having a hydrazine skeleton and the compound having a triazole skeleton, 2,2'-dihydroxy-3,3'-di-(α-methylcyclohexyl)-5,5'-dimethyl-diphenylmethane, tris-(2-methyl-4-hydroxy-5-tert-butylphenyl) butane, a mixture of 2-mercaptobenzimidazole and a phenolic condensate, and the like can be exemplified.

As the compound having a hydrazine skeleton, decamethylene dicarboxyl-disalicyloyl hydrazide is put into commercially available under the product name of ADEKA STAB CDA-6S manufactured by ADEKA Corporation, and 2',3-bis[3-[3,5-di-tert-butyl-4-hydroxyphenyl] propionyl] propionohydrazide is put into commercially available under the product name of IRGANOX MD1024 manufactured by Ciba Specialty Chemicals Co., Ltd. (currently BASF Japan Ltd.).

As the compound having a triazole skeleton, 3-(N-salicyloyl) amino-1,2,4-triazole is put into commercially available under the product name of ADEKA STAB CDA-1 and CDA-1M manufactured by ADEKA Corporation.

When the total amount of the resin components contained in the resin composition (P) is defined as 100 parts by mass, the content of the metal inactivating agent (C) in the resin composition (P) according to the present embodiment is preferably equal to or more than 0.05 parts by mass and more preferably equal to or more than 0.10 parts by mass. When the content of the metal inactivating agent (C) is equal to or more than the above-described lower limit value, it is possible to further improve the yellowing resistance of solar cell encapsulants. The upper limit of the content of the metal inactivating agent (C) is not particularly limited, but is, for example, equal to or less than 5.0 parts by mass, preferably equal to or less than 3.0 parts by mass, and more preferably equal to or less than 1.0 part by mass.

<Other Components>

In the resin composition (P) according to the present embodiment, components other than the ethylene-polar monomer copolymer (A1), the epoxy group-containing ethylene-based copolymer (A2), the ethylene-α-olefin copolymer (B), and the metal inactivating agent (C) can be contained to an extent that the object of the present invention is not impaired. The other components are not particularly limited, and examples thereof include a plasticizer, an oxidation inhibitor, an ultraviolet absorber, a wavelength conversion agent, an antistatic agent, a surfactant, a colorant, a lightfastness stabilizer, a foaming agent, a lubricating agent, a crystal nucleating agent, a crystallization accelerator, a crystallization retardant, a catalyst deactivator, a heat ray absorber, a heat ray reflecting agent, a heat dissipating agent, a thermoplastic resin, a thermosetting resin, an inorganic filler, an organic filler, an impact resistance improving agent, a slip agent, a cross-linking agent, a cross-linking aid, a tackifier, a processing aid, a mold release agent, a hydrolysis inhibitor, a heat-resistant stabilizer, an antiblocking agent, an antifogging agent, a flame retardant, a flame retardant aid, a light diffusing agent, an antibacterial agent, an antifungal agent, a dispersant, other resins, and the like. The other components may be used singly, or two or more kinds thereof may be used in combination.

2. Solar Cell Encapsulant

A solar cell encapsulant according to the present embodiment includes a layer formed of the resin composition (P) according to the present embodiment.

The solar cell encapsulant according to the present embodiment may have a single-layer constitution or may have a multilayer constitution of two or more layers.

More specifically, the solar cell encapsulant according to the present embodiment may be a film having a single-layer constitution made of a layer formed of the resin composition (P) according to the present embodiment, may be a film having a multilayer constitution made up of two or more layers formed of the resin composition (P) according to the present embodiment, or may be a film having a multilayer constitution having at least one layer formed of the resin composition (P) according to the present embodiment and at least one layer other than the layer formed of the resin composition (P) according to the present embodiment.

A layer formed of the solar cell encapsulant according to the present embodiment is also referred to as an encapsulated resin layer. The encapsulated resin layer may have a single-layer constitution or a multilayer constitution of two or more layers.

Examples of the layer other than the layer formed of the resin composition (P) according to the present embodiment include layers formed of a resin composition containing at least one kind of ethylene-based copolymer selected from an ethylene-vinyl ester copolymer, an ethylene-α-olefin copolymer, and an ionomer of an ethylene-unsaturated carboxylic acid-based copolymer. As the ethylene-vinyl ester copolymer and the ethylene-α-olefin copolymer, for example, the above-described ethylene-vinyl ester copolymer and ethylene-α-olefin copolymer can be used.

The ionomer of the ethylene-unsaturated carboxylic acid-based copolymer is a resin in which at least a part of carboxyl groups in a polymer obtained by copolymerizing ethylene and at least one kind of unsaturated carboxylic acid have been neutralized with metal ions. As the ethylene-unsaturated carboxylic acid-based copolymer, a copolymer containing ethylene and an unsaturated carboxylic acid, a copolymer containing ethylene, an unsaturated carboxylic acid, and an unsaturated carboxylic acid ester, and the like can be exemplified. Examples of the unsaturated carboxylic acid that constitutes the ionomer of the ethylene-unsaturated carboxylic acid-based copolymer include acrylic acid, methacrylic acid, 2-ethylacrylic acid, crotonic acid, maleic acid, fumaric acid, itaconic acid, maleic anhydride, fumaric anhydride, itaconic anhydride, monomethyl maleate, monoethyl maleate, and the like. In the present embodiment, the ethylene-unsaturated carboxylic acid-based copolymer is particularly preferably an ethylene-(meth)acrylic acid copolymer and an ethylene-(meth)acrylic acid-(meth)acrylic acid ester copolymer. Examples of the metal ions that constitute the ionomer of the ethylene-unsaturated carboxylic acid-based copolymer according to the present embodiment include one or more kinds selected from the group consisting of a lithium ion, a potassium ion, a sodium ion, a silver ion, a copper ion, a calcium ion, a magnesium ion, a zinc ion, an aluminum ion, a barium ion, a beryllium ion, a strontium ion, a tin ion, a lead ion, an iron ion, a cobalt ion, and a nickel ion.

The layer other than the layer composed of the resin composition (P) according to the present embodiment is preferably a resin sheet formed of an ethylene-vinyl acetate copolymer (EVA), an ethylene-α-olefin copolymer, and an ionomer of an ethylene-unsaturated carboxylic acid-based copolymer. As this layer, for example, a layer known as a solar cell encapsulant can be used.

In a case where the solar cell encapsulant according to the present embodiment has a multilayer constitution, the layer formed of the resin composition (P) according to the present embodiment is used on a side where the solar cell encapsulant comes into contact with a metal material. This makes it possible to more effectively suppress the yellowing of the solar cell encapsulant.

The thickness of the solar cell encapsulant according to the present embodiment is, for example, equal to or more than 0.001 mm and equal to or less than 10 mm, preferably equal to or more than 0.01 mm and equal to or less than 5 mm, and more preferably equal to or more than 0.05 mm and equal to or less than 2 mm.

When the thickness of the solar cell encapsulant is equal to or more than the lower limit value, it is possible to further improve the mechanical strength or insulating properties of the solar cell encapsulant. In addition, when the thickness of the solar cell encapsulant is equal to or less than the upper limit value, it is possible to further improve the transparency of solar cell encapsulants to be obtained.

In addition, in a case where the solar cell encapsulant according to the present embodiment has a laminated structure in which a layer formed of the resin composition (P) and a layer formed of a resin composition containing at least one kind of ethylene-based copolymer selected from an ethylene-vinyl ester copolymer, an ethylene-α-olefin copolymer, and an ionomer of an ethylene-unsaturated carboxylic acid-based copolymer are laminated, the thickness of the layer formed of the resin composition (P) is, for example, equal to or more than 10 μm and equal to or less than 900 μm.

A manufacturing method of a solar cell encapsulant according to the present embodiment is not particularly limited, and a conventionally known manufacturing method can be used.

As the manufacturing method of a solar cell encapsulant according to the present embodiment, for example, a press molding method, an extrusion molding method, a T-die molding method, an injection molding method, a compression molding method, a cast molding method, a calender molding method, an inflation molding method, and the like can be used. Among these, the extrusion molding method is preferable. That is, the solar cell encapsulant according to the present embodiment can be obtained by, for example, a manufacturing method including a step of extruding the resin composition (P) according to the present embodiment into a sheet shape.

3. Solar cell module

FIG. 1 is a cross-sectional view schematically illustrating an example of the structure of a solar cell module 1 according to the embodiment of the present invention.

The solar cell module 1 according to the present embodiment includes, for example, solar cell elements 3 and an encapsulated resin layer 5 formed of the solar cell encapsulant according to the present embodiment that encapsulates the solar cell elements 3. The solar cell module 1 according to the present embodiment may further include a substrate 2 on which sunlight is incident, a protective material 4, or the like as necessary. There will be cases where the substrate 2 on which sunlight is incident is simply referred to as the substrate 2.

In the solar cell module 1 according to the present embodiment, for example, the solar cell elements 3 are sandwiched by the encapsulated resin layer 5, and these are further sandwiched by the substrate 2 and the protective material 4 to form a laminate. Next, the solar cell module 1 can be produced by heating and pressurizing the laminate to attach the individual members.

As such a solar cell module 1, various types of solar cell modules may be exemplified. Examples thereof include a solar cell module having a constitution in which a solar cell element is sandwiched by encapsulants from both sides by laminating a substrate, the encapsulant, the solar cell element, the encapsulant, and a protective material in this order; a solar cell module constituted by laminating a solar cell element formed in advance on the surface of a substrate such as glass in the order of the substrate, the solar cell element, a encapsulant, and a protective material; a solar cell module having a constitution in which a encapsulant and a protective material are formed on a solar cell element formed on the inner peripheral surface of a substrate, for example, an amorphous solar cell element produced on a fluororesin-based sheet by sputtering; and the like.

When the substrate 2 on which sunlight is incident is placed in the upper part of the solar cell module 1, the protective material 4 is provided on a side of the solar cell module 1 opposite to the substrate 2, that is, in the lower part, and is thus referred to as the lower protective material or rear surface protective material in some cases.

As the solar cell element 3, various solar cell elements such as silicon-based solar cell elements containing single crystal silicon, polycrystalline silicon, amorphous silicon, or the like; Group III-V or Group II-VI compound semiconductor-based solar cell elements containing gallium-arsenic, copper-indium-selenium, copper-indium-gallium-selenium, cadmium-tellurium, or the like; and heterojunction-type solar cell elements of amorphous silicon and single crystal silicon can be used.

In the solar cell module 1, a plurality of the solar cell elements 3 are electrically connected in series through interconnectors 6.

The solar cell module 1 according to the present embodiment usually includes a metal material provided adjacent to the encapsulated resin layer 5. In addition, in the solar cell module 1, in a case where the encapsulated resin layer 5 has a multilayer constitution of two or more layers, in the layer constitution of the encapsulated resin layer 5, a layer formed of the resin composition (P) is in contact with at least a part of the metal material. In other words, the layer formed of the resin composition (P) is positioned on at least one surface of the encapsulated resin layer 5, and the surface of the encapsulated resin layer 5 on the side of the layer formed of the resin composition (P) is in contact with at least a part of the metal material, for example, one surface of the metal material. Since the layer formed of the resin composition (P) according to the present embodiment is excellent in terms of yellowing resistance, it is possible to suppress yellowing even in a case where the encapsulated resin layer 5 is in contact with the metal material.

Examples of the metal material include a bus bar electrode, an interconnector, a finger electrode, and the like. Such metal materials are usually wiring, electrodes, and the like.

The bus bar electrode, the interconnector, and the finger electrode are used in modules to join solar cell elements or to collect generated electricity.

The metal material contains, for example, at least one metal selected from copper, tin, lead, iron, bismuth, aluminum, and silver. Here, in a case where the metal material contains copper, since the yellowing of the solar cell encapsulant is likely to occur, the solar cell encapsulant according to the present embodiment is particularly effective for solar cell modules in which the metal material contains copper.

Examples of the substrate 2 that constitutes the solar cell module 1 according to the present embodiment include glass, an acrylic resin, a polycarbonate, a polyester, a fluorine-containing resin, and the like.

The protective material 4 (lower protective material) is a single substance of metal, various inorganic materials, various thermoplastic resin films, or the like or a multilayer sheet thereof, and examples thereof include single-layer or multilayer sheets made of metal such as tin, aluminum, or stainless steel; an inorganic material such as glass; a thermoplastic resin film of a polyester, an inorganic vapor deposited polyester, a fluorine-containing resin, a polyolefin, or the like. The solar cell encapsulant according to the present embodiment exhibits favorable adhesiveness to the substrate 2 or the protective material 4.

The manufacturing method of the solar cell module 1 is not particularly limited, and examples thereof include the following method.

First, a plurality of the solar cell elements 3 electrically connected using the interconnectors 6 are sandwiched by the solar cell encapsulants, and these solar cell encapsulants are further sandwiched by the substrate 2 and the protective material 4, thereby producing a laminate. Next, the laminate is heated and pressurized to attach the individual members, thereby obtaining the solar cell module 1.

Hitherto, the embodiment of the present invention has been described with reference to the drawing, but this is an example of the present invention, and it is also possible to adopt various constitutions other than the above-described constitution.

EXAMPLES

Hereinafter, the present invention will be specifically described based on examples, but the present invention is not limited to these examples.
(1) Evaluation Methods
[Evaluation of Yellowing Resistance]

Laminates obtained in examples and comparative examples were left to stand at 140° C. for 144 hours or 288 hours. The central parts of the laminates were visually observed, and the yellowing resistance was evaluated based on the following criteria.

A: Yellowing was rarely visible around a conductive wire or a part where yellowing was visible was within 0.5 mm from the conductive wire.

B: Yellowing was slightly visible around the conductive wire or the part where yellowing was visible was more than 0.5 mm and within 1 mm from the conductive wire.

C: Yellowing was immediately visible around the conductive wire or a range where yellowing was visible was more than 1 mm from the conductive wire.
(2) Materials The details of materials used for the production of solar cell encapsulants are as described below.
(2-1) Mixture of Ethylene-Polar Monomer Copolymer (A1) Modified with Silane Coupling Agent and Epoxy Group-Containing Ethylene-Based Copolymer (A2)

49 parts by mass of an ethylene-glycidyl methacrylate-vinyl acetate copolymer (EGMAVA, manufactured by Sumitomo Chemical Co., Ltd., BONDFAST 7B, ethylene content: 83% by mass, glycidyl methacrylate content: 12% by mass, vinyl acetate content: 5% by mass, MFR (190° C., load of 2160 g): 7 g/10 minutes), 49 parts by mass of an ethylene-vinyl acetate copolymer (vinyl acetate content: 19% by mass, MFR (190° C., load of 2160 g): 47 g/10 minutes), 1.5 parts by mass of 3-methacryloxypropyltrimethoxysilane (manufactured by Shin-Etsu Chemical Co., Ltd., trade name "KBM503"), and 0.5 parts by mass of 2,5-dimethyl-2,5-di(t-butylperoxy)hexane (manufactured by Alkema Yoshitomi, Ltd., trade name "LUPEROX 101") were mixed in advance and graft-polymerized with a 40 map single-screw extruder at a melting temperature of 220° C., thereby obtaining a mixture of an ethylene-polar monomer copolymer (A1) modified with a silane coupling agent and an epoxy group-containing ethylene-based copolymer (A2).
(2-2) Ethylene-α-Olefin Copolymer (B)

Ethylene-α-olefin copolymer (B-1): Ethylene-α-olefin copolymer (manufactured by Mitsui Chemicals, Inc., TAFMER A-4090S, MFR: 3.6 g/10 minutes, density: 893 kg/m$^3$)
(3) Various Additives Phenolicantioxidant 1: Irganox 1010, manufacturedby-BASFJapan Ltd.

Lightfastness stabilizer 1: Tinuvin 770 DF, manufactured by BASF Japan Ltd.

Metal inactivating agent 1: Decamethylene dicarboxyl-disalicyloyl hydrazide (ADEKA STAB CDA-6S, manufactured by ADEKA Corporation)

Metal inactivating agent 2: 3-(N-salicyloyl) amino-1,2,4-triazole (ADEKA STAB CDA-1, manufactured by ADEKA Corporation)
(4) First Layer Sheet PO: Polyolefin-based encapsulant (thickness: 450 μm, density: 880 kg/m$^3$)

EVA: Ethylene-vinyl acetate copolymer (EVA)-based encapsulant (thickness: 600 μm, density: 950 kg/m$^3$)

Examples 1 to 4 and Comparative Example 3

Individual components were melted and kneaded at 175° C. in formulation proportions shown in Table 1 to obtain individual resin compositions. Next, the obtained resin compositions were press-molded with a heat press machine to produce sheet-shaped solar cell encapsulants having a thickness of 0.1 mm.

Next, copper wires having a diameter of 0.4 mm were bundled and arranged on a TPT back sheet (BEC-301, manufactured by Hangzhou First PV MATERIAL Co., Ltd) cut out to 25 mm×25 mm, and each of the sheet-shaped solar cell encapsulants obtained above (second layer), the first layer sheet, and a PET (polyethylene terephthalate) sheet were overlaid in this order in a constitution shown in Table 1 on the copper wires, thereby manufacturing a laminated sheet. Next, the obtained laminated sheets were heated to 150° C. for 3 minutes under a vacuum and then heated at 150° C. for 5 minutes under pressure to produce individual laminates.

Here, in Table 1, the units (phr) of the amounts of various additives formulated indicate parts by mass when the total of the resin components was defined as 100 parts by mass.

Comparative Examples 1 and 2

Copper wires having a diameter of 0.4 mm were bundled and arranged on a TPT back sheet (BEC-301, manufactured by Hangzhou First PV MATERIAL Co., Ltd) cut out to 25 mm×25 mm, and the first layer sheet and a PET (polyethylene terephthalate) sheet were overlaid in this order in a constitution shown in Table 1 on the copper wires, thereby manufacturing a laminated sheet. Next, the obtained laminated sheets were heated to 150° C. for 3 minutes under a vacuum and then heated at 150° C. for 5 minutes under pressure to produce individual laminates.

The above-described evaluations were performed on each of the obtained laminates. The obtained results are shown in Table 1.

TABLE 1

| | | | Example 1 | Example 2 | Example 3 | Example 4 | Comparative Example 1 | Comparative Example 2 | Comparative Example 3 |
|---|---|---|---|---|---|---|---|---|---|
| First layer (PET side) | | | PO | PO | EVA | PO | EVA | PO | PO |
| Second layer (copper wire side) | Mixture of ethylene-polar monomer copolymer (A1) modified with silane coupling agent and epoxy group-containing ethylene-based copolymer (A2) | % by mass | 10 | 10 | 10 | 10 | | | 10 |
| | Ethylene-α-olefin copolymer (B-1) | % by mass | 90 | 90 | 90 | 90 | | | 90 |
| | Metal inactivating agent 1 | phr | 0.2 | 0.2 | 0.2 | | | | |
| | Metal inactivating agent 2 | phr | | | | 0.2 | | | |
| | Phenolic antioxidant 1 | phr | | 0.03 | 0.03 | | | | |
| | Lightfastness stabilizer 1 | phr | | 0.2 | 0.2 | | | | |
| Yellowing resistance | After 144 hours | | A | A | A | A | C | C | B |
| | After 288 hours | | A | A | A | A | C | C | C |

The laminates of Examples 1 to 4 were superior in terms of the yellowing resistance to the laminates of Comparative Examples 1 to 3.

This application claims priority on the basis of Japanese Patent Application No. 2019-226268 filed on Dec. 16, 2019, the entire disclosure of which is incorporated herein by reference.

REFERENCE SIGNS LIST

1: Solar cell module
2: Substrate
3: Solar cell element
4: Protective material
5: Encapsulated resin layer
6: Interconnector

The invention claimed is:

1. A resin composition for a solar cell encapsulant, the resin composition comprising:
at least one kind of ethylene-polar monomer copolymer (A1) selected from an ethylene-vinyl ester copolymer and an ethylene-unsaturated carboxylic acid ester copolymer;
an epoxy group-containing ethylene-based copolymer (A2) (excluding the ethylene-polar monomer copolymer (A1));
an ethylene-α-olefin copolymer (B); and
a metal inactivating agent (C),
wherein at least a part of the ethylene-polar monomer copolymer (A1) and the epoxy group-containing ethylene-based copolymer (A2) is modified with a silane coupling agent.

2. The resin composition for a solar cell encapsulant according to claim 1,
wherein a density of the ethylene-α-olefin copolymer (B) is 910 kg/m$^3$ or less.

3. The resin composition for a solar cell encapsulant according to claim 1,
wherein, when a total of the resin composition for a solar cell encapsulant is defined as 100% by mass, a content of the ethylene-α-olefin copolymer (B) is 80% by mass or more.

4. The resin composition for a solar cell encapsulant according to claim 1,
wherein the metal inactivating agent (C) contains at least one kind selected from a compound having a hydrazine skeleton and a compound having a triazole skeleton.

5. The resin composition for a solar cell encapsulant according to claim 1,
wherein, when a total amount of resin components that are contained in the resin composition for a solar cell encapsulant is defined as 100 parts by mass, a content of the metal inactivating agent (C) is 0.05 parts by mass or more.

6. The resin composition for a solar cell encapsulant according to claim 1,
wherein the epoxy group-containing ethylene-based copolymer (A2) contains at least one kind selected from an ethylene-glycidyl (meth)acrylate copolymer, an ethylene-glycidyl (meth)acrylate-vinyl acetate copolymer, and an ethylene-glycidyl (meth)acrylate-(meth)acrylate ester copolymer.

7. The resin composition for a solar cell encapsulant according to claim 1,
wherein, in the epoxy group-containing ethylene-based copolymer (A2), when a total of constituent units that constitute the epoxy group-containing ethylene-based copolymer (A2) is defined as 100% by mass, an ethylene-derived constituent unit is 70% by mass or more and 95% by mass or less.

8. A solar cell encapsulant comprising:
a layer formed of the resin composition for a solar cell encapsulant according to claim 1.

9. A solar cell encapsulant,
wherein a layer formed of the resin composition for a solar cell encapsulant according to claim 1 and a layer formed of a resin composition containing at least one kind of ethylene-based copolymer selected from an ethylene-vinyl ester copolymer, an ethylene-α-olefin copolymer, and an ionomer of an ethylene-unsaturated carboxylic acid-based copolymer are laminated.

10. A manufacturing method of a solar cell encapsulant, the method comprising:
a step of extruding the resin composition for a solar cell encapsulant according to claim 1 into a sheet shape.

11. A solar cell module comprising:
a solar cell element; and
an encapsulated resin layer formed of the solar cell encapsulant according to claim 8 that encapsulates the solar cell element.

12. The solar cell module according to claim 11, further comprising:
a metal material provided adjacent to the encapsulated resin layer, wherein a layer formed of the resin composition for a solar cell encapsulant that constitutes the encapsulated resin layer and at least a part of the metal material are in contact with each other.

13. The solar cell module according to claim 12, wherein the metal material contains at least one kind of metal selected from copper, tin, lead, iron, bismuth, aluminum, and silver.

14. The solar cell module according to claim 12, wherein the metal material contains copper.

* * * * *